United States Patent
Caselles Fornés

(10) Patent No.: US 9,520,519 B2
(45) Date of Patent: Dec. 13, 2016

(54) DIRECT SOLAR-RADIATION COLLECTION AND CONCENTRATION ELEMENT AND PANEL

(76) Inventor: Jaime Caselles Fornés, Alicante (ES)

( * ) Notice: Subject to any disclaimer, the term of this patent is extended or adjusted under 35 U.S.C. 154(b) by 500 days.

(21) Appl. No.: 13/983,117

(22) PCT Filed: Feb. 11, 2011

(86) PCT No.: PCT/ES2011/070090
§ 371 (c)(1),
(2), (4) Date: Aug. 30, 2013

(87) PCT Pub. No.: WO2012/107605
PCT Pub. Date: Aug. 16, 2012

(65) Prior Publication Data
US 2013/0327400 A1     Dec. 12, 2013

(51) Int. Cl.
*H01L 31/0232*     (2014.01)
*H01L 31/052*      (2014.01)
*G06F 17/50*       (2006.01)
*H01L 31/054*      (2014.01)
*F24J 2/08*        (2006.01)
(Continued)

(52) U.S. Cl.
CPC ............. *H01L 31/0524* (2013.01); *F24J 2/08* (2013.01); *F24J 2/38* (2013.01); *F24J 2/5232* (2013.01); *F24J 2/5417* (2013.01); *G06F 17/50* (2013.01); *H01L 31/0232* (2013.01); *H01L 31/0543* (2014.12); *H01L 31/0547* (2014.12); *H02S 20/32* (2014.12); *F24J 2/085* (2013.01);
(Continued)

(58) Field of Classification Search
CPC ............. H01L 31/0524; H01L 31/0547; H01L 31/0543; H01L 31/0232; H02S 20/32; F24J 2/38; F24J 2/5232; F24J 2/5417; F24J 2/085; F24J 2/15; F24J 2002/5462
USPC .......................................................... 136/244
See application file for complete search history.

(56) References Cited

U.S. PATENT DOCUMENTS 4,159,710 A * 7/1979 Prast .......................... F24J 2/07
                                                    126/579
4,297,521 A   10/1981 Johnson
(Continued)

FOREIGN PATENT DOCUMENTS

EP     0 128 395 A2    12/1984
EP     0922914 A2       6/1999
(Continued)

*Primary Examiner* — Jayne Mershon
(74) *Attorney, Agent, or Firm* — Ladas & Parry LLP

(57) ABSTRACT

Element, panel and direct solar radiation collecting and concentrating system by means of panels with collecting and concentrating elements which are allowed freedom of movement during diurnal and seasonal sun tracking. The elements in question incorporate a primary lens concentrating direct radiation. The element includes hollow compartments which contain a given fluid at a given pressure. The lower section includes a secondary lens and/or internally reflexive conical element allowing the introduction of radiation, in parallel, into tubes or optical fiber, or irradiation onto radiation converting systems. The movement of the device is produced by fluid heating and pressure in the side compartments. This pressure is communicated to the axes via pistons which cause the device to rotate in search of the optimal position with a view to optimizing its focus on the secondary lens.

14 Claims, 12 Drawing Sheets

(51) Int. Cl.
    *F24J 2/38*   (2014.01)
    *F24J 2/52*   (2006.01)
    *F24J 2/54*   (2006.01)
    *F24J 2/15*   (2006.01)

(52) U.S. Cl.
    CPC .......... *F24J 2/15* (2013.01); *F24J 2002/5462* (2013.01); *Y02E 10/47* (2013.01); *Y02E 10/52* (2013.01)

(56) References Cited

U.S. PATENT DOCUMENTS

| | | | |
|---|---|---|---|
| 4,306,541 A * | 12/1981 | Morrison | F24J 2/14 126/580 |
| 2004/0112373 A1 | 6/2004 | Djeu | |
| 2004/0246596 A1 | 12/2004 | Dyson et al. | |
| 2005/0034752 A1 * | 2/2005 | Gross | F24J 2/38 136/246 |
| 2008/0041441 A1 | 2/2008 | Schwartzman | |
| 2010/0212654 A1 | 8/2010 | Alejo Trevijano | |
| 2010/0282299 A1 * | 11/2010 | Dyson | F24J 2/085 136/246 |

FOREIGN PATENT DOCUMENTS

| | | |
|---|---|---|
| ES | 2 011 399 A6 | 1/1990 |
| ES | 2 171 082 T3 | 2/2001 |
| ES | 2 199 167 T3 | 3/2002 |
| ES | 2 281 231 A1 | 9/2007 |
| ES | 1 065 694 U | 10/2007 |
| GB | 1 562 912 | 3/1980 |
| WO | 2006/118912 A2 | 11/2006 |
| WO | 2007/036199 A2 | 4/2007 |
| WO | 2008/115305 A2 | 9/2008 |
| WO | 2009/007485 A2 | 1/2009 |
| WO | 2009/058424 A1 | 5/2009 |

\* cited by examiner

DIRECT SOLAR-RADIATION COLLECTION AND CONCENTRATION ELEMENT AND PANEL

RELATED APPLICATION INFORMATION

This application is a 371 of International Application PCT/ES2011/070090 filed 11 Feb. 2011 entitled "Direct Solar-Radiation Collection And Concentration Element And Panel", which was published on 16 Aug. 2012, with International Publication Number WO 2012/107605,

FIELD OF THE INVENTION

This invention relates to the technical field of elements, panels, systems and procedures for optimizing solar radiation energy collection by concentrating and redirecting it towards centres for the direct conversion of solar radiation energy into electrical energy, in the course of its intermediate passage through thermal energy or photovoltaic transformation, or its optimization in, for example, fluid purification systems or hydrogen generation systems via water thermolysis at high temperatures or other thermo-electric processes.

STATE OF THE ART

The main drawbacks, nowadays, of generating electricity on a massive scale via solar energy are the production costs by Kwh and the consequent terms for a return on investment. It is believed that the cost of producing solar-photovoltaic, solar-thermal and eolic energy is 7, 5, or 4 times greater than that of generation by fossil fuel. This has forced governments to prioritize their production to reduce dependence on fossil fuels and their consequent greenhouse effect gas emissions in the shortest possible term.

In general, the most important systems optimizing solar energy may be considered to be those that exclusively make use of direct radiation and those additionally exploiting diffuse radiation.

The collection of diffuse solar radiation does not require sun position tracking devices. The collection of direct solar radiation, however, requires sun position tracking which is carried out in the vast majority of plants via the use of heliostats formed by large panels, supported by metal structures which are anchored to the ground and track the position of the sun via electromotor devices controlled by a processor. The concentrated radiation may be optimized directly on the panel via photovoltaic cells, or by reflection via mirrors on specific points which transform heat energy into electricity via steam turbines.

With a view to increasing the performance of solar energy, numerous systems have been designed for daily and/or seasonal solar tracking, generating either photovoltaic energy and/or thermal energy. The different commercialized systems are generally based on the orientation of collecting surfaces via active electrical systems which are driven by electric motors to achieve movement, via posts, arcs, parabolic mirrors, etc., fixed onto rotating axes.

The disadvantages of these systems are the costs involved in large excavations and cementing for the panel infrastructures, the production and assembly of metal support structures, the introduction of tracking motor systems and their precise control, all developed to resist the effects produced by wind and other climatic factors.

An example of these practical applications are the large solar-tower power plants comprising mirrors which reflect sun rays onto a target area located at the top of a high tower. These systems exploit the thermal energy produced by high concentrations of sun rays, reaching temperatures and pressures to allow steam turbines to function in a similar fashion to most electrical energy generating systems whether they are based on nuclear energy, gas or fossil fuel. It is believed that 70% of the energy produced today is generated through water steam.

Daily and/or seasonal solar tracking systems have also been introduced for electricity generation purposes via photovoltaic cells, such as those referred to in previous paragraphs, although without the use of reflecting mirrors, i.e. simply for the purpose of placing solar panels in the normal direction of the rays of the sun. It is believed that the introduction of solar tracking systems increases electricity production by 30%.

Other systems for collecting solar energy are being commercialized via panels incorporating multiple lenses of different types, shapes and sizes or multiple parabolic mirrors, to concentrate solar radiation in small areas where small, next-generation photovoltaic cells have been included. These systems are based on reducing the need to cover extensive surfaces with photovoltaic cells and the possibility of using much more expensive and efficient cells is consequently made available.

Moreover, solar thermal systems are classified into low, medium or high concentration systems, using different devices, including cylindro-parabolic devices, Stirling parabolic discs or solar plants with a central tower and heliostats. In order to reach high concentrations and consequently high temperatures, it is necessary to use large solar plants with a central tower and heliostats, consequently being limited to high levels of concentration and temperature and to big investments in sizeable facilities for large-scale generation.

The following systems are worthy of mention among those already known and active:

1.—Systems pertaining to the use of concentrating lenses:
   There are many patent documents which refer to the use of concentrating lenses, their arrangement, shape and physical profile and the rather varied composition of the materials comprising them.
   Those worthy of mention as reference documents, among others, include document ES 2011399, which refers to the use of a Fresnel lens to concentrate solar radiation where focused radiation is introduced into an optical tube via a conical optical attachment. Document US 20080041441 A1 also refers to the use of a solar energy concentrating lens with a photovoltaic cell incorporated to its focal point. Document WO 200736199 A2 refers to the use of a concentrating photovoltaic panel comprising multiple lenses fixed and adjacent to a large panel which focus radiation onto multiple photovoltaic cells. Document WO 200958424 A1 refers to the use of Fresnel lenses to concentrate radiation onto a photovoltaic cell which includes cooling mechanisms. Document EP 128395 B1 refers to the use of hexagonal lenses inserted into inverted, truncated, hexagonal pyramids, on a panel, the base of which incorporates concentrated lenses which focus onto an optical tube and an expansion mechanism is created to avoid damage due to the dilation of the elements in cases of excessive temperature. Document ES 2281231 A1 refers to the use of a solar liquid lens comprising several transparent containers filled with reflective fluids with different refraction indexes and extremely low volumes. Other commercialized systems use concentrated lenses forming large flat panels with multiple lenses arranged adjacently which concentrate onto photovoltaic cells, incorporating cooling mechanisms in some cases. These large panels are moved by electromotor devices which tilt the panel to orient it towards the position of the sun.

2.—Sun Tracking:

There are multiple sun tracking devices which may be categorized into active systems using electromotor mechanisms to cause movement, and passive systems which cause movement via the transfer or pressure of fluid by the heat produced in any area receiving sunlight in comparison to shaded areas.

Turning to the documents describing active systems, utility model ES 1065694U, which uses the solar inclination angle, GPS signals and stepping motors to manage movement, is worthy of mention among others. Document ES 2199167 T3 also achieves solar tracking actively although not on the basis of rotational movement, but rather via the longitudinal movement of a panel incorporating concentrating lenses, which is powered by engines and allows the lenses to produce concentration in the same established areas when in motion, regardless of the position of the sun.

There are many solar power plants in existence today which have been commercialized and installed by various companies either for thermal or photovoltaic generation purposes and which use sun tracking systems with computer controlled engines/motors with a view to pointing large panels to appropriate and precise positions.

Among documents describing passive systems, document ES 2171082 T3 is worthy of mention. It refers to a panel incorporating lateral absorption tubes which are illuminated by various reflecting elements which allow the internal fluid in the absorption tubes to produce greater or less heat, thus achieving the strength required for sun tracking purposes. This document also refers to the provision of mechanisms for position micro-adjustment as well as other mechanisms for repositioning to an initial position.

Document WO 200907485 A2 also refers to the use of passive positioning systems. The invention relates to a concave reflective surface, of cylindro-parabolic shape, with an axis in the centre on which the module rotates. It mentions that the sun tracking movement may be produced by the variation/transfer of fluids in a mechanical way due to equalization of pressure among the parts caused by the heating of the fluid, or also electrically, via a pump associated to a light sensor or timer.

Until now, these passive tracking systems have not been developed commercially and/or industrially, at least on a large scale.

The present invention resolves the drawbacks of active systems, which require controllers and additional activator infrastructure (control and tracking motor/engine systems) for sun tracking, and of passive systems, which are not adapted for use in flexible solutions in terms of both the cost of manufacture and infrastructure locations (excavations and foundations for panel infrastructures, development conditions required to resist the effects produced by wind and other climatic factors) in locations where solar energy is collected.

In view of the foregoing, an object of the invention is to lower the cost of solar energy generation by Kwh through the creation of a device and system allowing the collection and concentration of direct solar radiation without incurring the high costs involved in excavations, foundation laying, support structures, electromotive devices for controlled movements and panel positioning control systems, and to allow the use of a concentrating solar system on any kind of surface, not necessarily in the form of large solar plants, with the same concentration levels and consequently the same uses as large power plants with minimum visual impact, optimizing land use.

SUMMARY

Solutions to the number of problems referred to above may be achieved via the use of panels comprising multiple, identical, mobile collecting elements which concentrate radiation via lenses focusing radiation into optical tubes or optical fibre or photovoltaic cells. The movement of each one of these devices is independent (or passive) via heating by solar radiation and the consequent amount of pressure on a given fluid, causing the device to rotate in search of optimum radiation for the device, focusing the resulting concentrated radiation onto an optical tube or fibre.

The advantages of the system are its capacity to collect and concentrate direct solar radiation, without having to incur the high costs involved in the precise orientation of large panels via heliostats, opening the possibility of using large facilities on a considerable number of surfaces with minimum visual impact and greater optimization of land space. The reduction in cost is achieved by the standardized configuration of the elements which allow large scale production with the consequent financial benefits on a large scale, thus minimizing transportation costs and on site installation costs.

DESCRIPTION OF EMBODIMENTS

The panel for collecting and concentrating direct solar radiation comprises:
- a supporting frame (2A, 2F) with spacing elements on the panel supporting surface
- a supporting line (2C) with radiation collecting and concentrating elements (5)
- connecting elements to attach the supporting line (2C) to the supporting frame (2A, 2F)
- connecting elements to attach the radiation collecting and concentrating elements (5) to the supporting line (2C)
- radiation collecting and concentrating elements (5).

The panels comprise supporting structures for the numerous radiation collecting and concentrating elements (5), include a supporting frame (2A, 2F) (FIGS. 1 and 2) and supporting lines (2C) (FIG. 2).

Both the supporting frame (2A, 2F) and the supporting lines (2C) may be manufactured with hot dip galvanized steel to prevent corrosion.

Panel sizes may vary, for example they may measure 1 m×2 m, in T section, to be able to withstand lateral and vertical stress. Holes (2D) are drilled in the supporting lines for the attachment of connecting points for the movement arms of each of the radiation collecting and concentrating elements (5). The structure of the frame may be welded, screwed or riveted to the supporting lines, provided that they remain sufficiently rigid. The structure of the supporting frame (2A, 2F) must be separated from any supporting surface (for example the ground) and may be supported by legs (2E) or elevations using the ground or any surface of choice as a support, to allow the movement of the radiation collecting and concentrating elements (5). The legs (2E) may comprise extensible metal elements (FIG. 2) so as to vary the fixed position of the panel and orient it with more or less precision in north-south, east-west directions, depending on the slope of the surface where they may be placed.

The choice of connecting elements for the radiation collecting and concentrating elements (5) onto the supporting lines (2C) and of the aforesaid supporting lines (2C) onto the supporting frame (2A, 2F) may vary. For example, they may be secured via self-tapping screws, riveting or welding techniques.

As to the uniform arrangement of the radiation collecting and concentrating elements (5) on the supporting lines (2C) and the spacing between them, there is sufficient space between them to allow rotational movement around the axis (5F) of the collecting and concentrating element (5) in its diurnal (east-west) movement and rotational movement around the axis (5G) of the collecting and concentrating element (5) in its seasonal (north-south) movement.

It should be borne in mind that the space required for north-south movement around the axis (5G) of the radiation collecting and concentrating element (5) must be sufficiently ample for it to be oriented without any shaded areas at any time of year. Failure to measure the distance correctly would result in it not working to its full capacity during the corresponding time of year. This means that the lenses in the seasonal (north-south) axis must be arranged at a sufficient distance, simultaneously taking maximum advantage of the panel. The exact separation distance will be determined by the latitude of the location which, in turn determines the angle of the sun between the summer solstice (3C) and the winter solstice (3E) and the angle on a horizontal plane or supporting surface as well as the angle of the panel on the ground (2A), with our without the legs (2E) referred to above. This allows the panel (2A) to be placed in a horizontal position, parallel to the ground, or at a ground slope. The panel (2A) may consequently be perfectly attached to any surface minimally oriented to the source of radiation since the exact orientation may be gradually achieved by the movements of the radiation collecting and concentrating elements (5). The most advantageous position for minimum shading of the radiation collecting and concentrating devices (5) and consequently the best position with a view to optimizing the panel, is for the structure of the panel to face the equinox (3D) leaving the same angle to the north and south of the seasonal movement of the sun (3F). FIG. 3 reflects seasonal movements for locations in the northern hemisphere. The north-south poles would simply have to be inverted for locations in the southern hemisphere.

As to the different latitudes, the method for calculating the arrangement of the radiation collecting and concentrating elements (5) on a surface, with a view to maximizing the concentration of radiation incident on that surface, includes ascertaining the following points:

latitude of the location
the angle of the sun between the summer solstice (3C) and the winter solstice (3D)
the angle of the supporting frame (2A, 2F) in relation to the horizontal plane
the distance of the radiation collecting and concentrating elements (5) in the seasonal (north-south) axis depending on the aforesaid parameters to determine the arrangement of the radiation collecting and concentrating elements (5), respecting the distance calculated in the previous step, optimizing the available surface space of the panel (2A) and the upper surface of the radiation collecting and concentrating elements (5).

In addition, the use of a gear lever (8H) (FIG. 8) for the initial fixed position of the seasonal movement has been foreseen. This gear lever (8H) allows the individual positioning of each of the radiation collecting and concentrating elements (5) initially oriented towards the equinox, in which event the north-south trajectory of the element is the same. This option also includes another orientation adjusting mechanism during seasonal movement.

With a view to standardizing the production of the panel (2A) it would be advisable for the supporting lines (2C), which support the radiation collecting and concentrating elements (5), to be positioned in the direction of the north-south axis. In this way, the said panel (2A) and, generally, any structure which may be used as a support, may have the same dimensions, regardless of the geographical location of the panel (2A), since the distance between the supporting lines (2C) and the radiation collecting and concentrating elements (5) and the consequent size of the supporting arms (5E) of the radiation collecting and concentrating elements (5) would always be the same, regardless of the geographical location.

The diurnal (east-west) movement (FIG. 4) of the sun is much wider in range, i.e. 180°. According to this system, therefore, the radiation collecting and concentrating elements (5) are shaded at the beginning of the day (4B) and the end of the day (4A), since some of the radiation collecting and concentrating elements (5) project shade onto others (4D). However, solar radiation in the first and last hours of the day is lower since the rays of the sun penetrate the earth's atmosphere at a more oblique angle on having to travel a greater distance through said atmosphere (this is the effect which produces red/orange sunsets in view of the lower dispersion of wavelengths). Diurnal solar movement is the same in any potential location. The distance between lenses in the east-west axis may therefore always be the same, regardless of the where the panel may be situated. It is necessary to compromise between the loss of radiation during the first and last hours of the day and the distance between the lenses in order to make the best use of the panel. A good solution would be to leave a space between the lenses (4E) to enable them to be perfectly oriented towards the sun during two thirds of the duration of the diurnal movement of the sun. This means that it would be oriented 120° out of the total 180° and would be shaded for the first 30° of the start of the day and the last 30° of the end of the day. The loss in minutes of radiation would therefore depend on the season of the year and the latitude.

According to the content of the previous paragraphs, the panels may be placed on infinite surfaces with minimum solar orientation, with minimum anchoring elements to the ground/surface since they will always be placed parallel to the surface, thus avoiding the "sailing effect" caused by wind. Moreover, since there are spaces between the elements to allow the passage of wind, the effects of the wind on the panels are minimized, consequently diminishing the need for anchorage, rigidity of the modules, thus achieving a reduction in the rather high assembly and location costs. In other words, the collecting and concentrating panel comprises radiation collecting and concentrating elements (5) held by supporting lines (2C), which are shaped to allow the panel to adopt a curved shape, allowing the radiation collecting and concentrating elements (5) to face different angles.

The installation and assembly of the panels on site would be extremely fast and easy, pointing the diurnal axis of the radiation collecting and concentrating elements (5) towards the east-west axis. A compass would suffice to that effect. The extensible legs (2E) may be extended in conjunction with the position of the initial position gear lever (8H) so that the initial stationary position of the lever (8H) may point at the equinox, for which the latitude of the site is exclusively used. This may be determined via charts used to calculate the degree of elevation of a horizontal line or plane depending on the latitude. It is also necessary to ensure that the element is provided with sufficient freedom of movement and that there is no shading during its movement up to the summer and winter solstices.

The collecting and concentrating panel may be characterized in that said panel (2A) is flexible and may adopt irregular curved shapes.

Another way of arranging the supporting lines (2C) on the panel (2A) would be by using one, single supporting line (2C) of the panel (2A) to hold two lines of radiation collecting and concentrating elements (5), thus reducing the number of supporting lines (2C) by half, consequently lowering the cost of the panel (2A) structure. In other words, the supporting line (2C) holds two lines of radiation collecting and concentrating elements (5) for each connecting point on the supporting line (2C) of the structure, with two arms protruding from the east and west of the supporting line (2C), with two pyramids (5). Each one of the two pyramids (5) has its own, separate diurnal movement although one, single north-south seasonal movement.

The shape of the outer container of the radiation collecting and concentrating elements (5) may vary, i.e. conical, cylindrical, regular tetrahedrons (triangular based pyramids), square based pyramids or other regular polyhedrons (octahedrons, icosahedrons, dodecahedrons, etc. . . . ) or may be irregular.

The solar radiation collecting and concentrating element therefore comprises a container, with at least one upper surface on which a primary lens (5A) is placed. The primary lens (5A) is struck by radiation (6D) which is concentrated by the aforesaid primary lens (5A) onto a lower vertex of the container (6K), enabling said container to self rotate depending on the position of the source of radiation, in order to focus the radiation incident on the primary lens (5A) with precision.

In a preferred embodiment, the container is an inverted pyramid with a square base since the square shape of the upper surface (FIG. 5) utilizes the surface of the panel (2A) more efficiently. Moreover, since this configuration concentrates radiation on the vertex of the pyramid (6K) situated in the lower part thereof, the rays of sun are allowed to move freely up to the focal point, i.e. up to the vertex (6K) in question, with the least volume possible, therefore leaving more space for the support arms (5E, 7E, 7H) and the free circulation of wind.

The solar radiation collecting and concentrating elements comprises at least one hollow, air and water tight compartment (5B) on each side of the container, where a fluid is housed, with at least one communication hole or pressure outlet (10C, 10D). The uses of the aforementioned different components are explained in the following lines.

The radiation collecting and concentrating element (5) has at least one, hollow, air and water tight compartment (5B) on each of the triangular sides of the radiation collecting and concentrating element (5) (FIG. 5).

The internal surfaces of the pyramidal shape with an inverted square base of the radiation collecting and concentrating element (5), as seen in FIG. 5, are non reflexive and made of a material having high thermal conductivity. This may be achieved with a fine sheet (11D) of unpolished aluminium to prevent the reflection of light onto the other sides of the radiation collecting and concentrating element (5). The external surfaces of the radiation collecting and concentrating element (5) may be made up of different materials to render it sufficiently rigid, such as aluminium, brass, etc., via press moulding.

To facilitate the manufacturing process and achieve a reduction in the production costs of the external surfaces of the sides of the radiation collecting and concentrating element (5), injection tolerant materials may be used. Considering that the elements will be at the mercy of the weather for many years, it will be necessary to bear in mind the deterioration the materials of choice may endure for years in certain climatic conditions, such as the desert, with the consequent extreme temperatures, thus resulting in the choice of resistant materials, such as metal materials. Today there are highly resistant materials which are injection tolerant. Bearing in mind the conditions referred to above, the external surfaces of the solar radiation collecting and concentrating element container may be made of Bakelite.

It should also be borne in mind that the material must withstand the pressure introduced in the compartments (5B) as well as the pressure possibly reached due to an increase in temperature and consequently that reached in certain radiation concentrations. The sides must comprise airtight compartments excluding one point or hole for communicating pressure (5D, 10D, 10C) to the respective axes. If injection is chosen, the mould must provide for the pressure connection tubes for each of the sides up to the pressure communication holes on the axes in diurnal movement (7C) and seasonal movement (7G, 8A).

In this way, the hollow compartments (5B) are equipped with pressure communicating tubes (10F, 10G, 10H) on each side of the element, connected to the pressure outlets (10C, 10D) on the diurnal movement (7C) and seasonal movement (7G, 8A) axes.

FIG. 10 reflects the details of the shape of the mould. As may be observed, the mould is equipped with pressure communicating tubes (10F, 10G, 10H) which lead the pressure to the pressure outlets (10C, 10D) which, in turn, carry it to the arm mechanisms (5E, 9A) to produce movement. They also include holes for the introduction of fluid (5H) into the hollow compartments (5B).

Due to its mechanical and thermal characteristics, Bakelite or other resistant materials may be a good choice for the moulding of the pyramid (5), as indicated above.

A primary lens (5A) is attached onto the upper part of the pyramid (5A). The lens may be made of different materials and shapes depending on the atmospheric conditions it may have to withstand, the manufacturing costs, the refractive indices, its transmittance indices, thermal behaviour, etc. . . . To lower the cost of and standardize the manufacture of the primary lens (5A) a glass with a high transmittance index easily processed by moulding may be chosen, with an anti-reflective coating on both the upper and lower surfaces of the primary lens (5A). It is not necessary to use high precision optical lenses, it would suffice for the lens to focus on the secondary lens (5C). The transmittance index of the solar spectrum of the material comprising the primary lens (5A) is of relative importance as is the thickness required to produce focusing. The shape of the primary lens (5A) may be varied, from a Fresnel lens, to avoid much thickness, to a flat-convex lens, to avoid reflections on the external surface by the angle of incidence of solar radiation, up to GRIN lenses made of materials with different refractive indices.

The profile of the primary lens (5A) of the pyramid (5) may also include position microadjusting surfaces (11A) for areas which redirect the rays of the sun near the secondary lens (5C, 6C) or the internally reflexive conical element (6J), without which the rays would not be concentrated onto the lower focal point. This achieves a permanent small radiation onto the four sides of the pyramid once the pyramidal shape is focused. Any potential loss of permanent radiation on any of the sides would be due to imprecise focusing, which causes a small loss of pressure on the corresponding surface and produces the movement of the axes for the microadjustment to be made. The primary lens (5A) consequently includes position micro-adjusting surfaces (11A) which allow the incident radiation (6D) to concentrate on any of the sides of the container in order to produce a microadjustment of position until precise focusing of the radiation on the vertex (6K) of the element is achieved.

The lower vertex (6K) of the pyramid (5) may house a secondary lens (5C, 6C) inside or instead of an internally reflexive conical element (6J). The shape of the secondary lens (5C, 6C) may be varied. The objective of the differing shapes of the secondary lens (5C, 6C) is the concentration and redirection of the rays in the form of parallel rays. This may be achieved by determining the angle of incidence of the rays of the sun on entering and exiting the secondary lens (5C, 6C). It is possible to use a concave-concave secondary lens (5C, 6C) with anti-reflective coatings which would be the least thick lens required for effective redirection. There are other options, such as an upper convex surface, to diminish angles of incidence, consequently decreasing reflection. It would also be possible to use an internally reflexive conical element (6J) situated on the pyramidal vertex (6K). The internally reflexive conical element (6J) does not redirect the sun rays, in which case it would not, subsequently, be possible to control the redirection of the rays through the centre of the optical tubes/ducts/guides. This produces more reflections/refractions of the rays. It would be advisable, for the manufacture of the secondary lens (5C, 6C), to use the same material as that used for the primary lens (5A) and the secondary lens (5C, 6C) so that absorptions of the solar spectrum of the different materials may overlap. The primary lens (5A) and secondary lens (5C, 6C) are manufactured with the same material in the preferred embodiment. In addition, the internally reflexive conical element (6J), where the secondary lens (6C) may be housed, may be coated on the inside with a metal coating, such as polished aluminium, to increase reflection.

In order to ascertain the profiles of the respective lenses (5A, 6C) it is necessary to bear in mind the refractive index of each of the materials. Borosilicate glass is the preferred material in view of its high heat resistance and wide range of transmission of the solar spectrum. The refractive index of borosilicate glass is 1.473 for wavelengths of 587.6 nm. To calculate the lens surface profiles it would be necessary to apply Snell's law. Snell's law for the refraction of light establishes that the index of refraction in a medium by the sine of the angle of incidence is equivalent to the index of refraction of the other means by the sine of the angle of refraction. This law is determined by the fact that the speed of light varies according to the means it passes through. The first refraction would occur on the upper surface of the primary lens (5A) from passing through air to borosilicate glass. The refractive index of air is 1.0002926. The second refraction would occur on exiting the primary lens (5A) at a certain angle and entering the vacuum on the inside of the radiation collecting and concentrating device (5). The refractive index of a vacuum is 1.000000. The third refraction would occur from a vacuum to the borosilicate glass of the secondary lens (6C) with a certain angle of incidence depending on the area of incidence and the angle of the profile of the lens (6C) in that specific area. The fourth and last refraction would occur on exiting the secondary lens (6C) to the means existing in the conducting tube which should be in parallel and normal positions, perpendicular to the conducting tube or optical fibre.

Another embodiment contemplates replacing the secondary lens (6C) with a collimator to redirect the concentrated radiation received in parallel.

As to the securing the radiation collecting and concentrating elements (5) to the supporting lines/guide (2C) of the structure of the panel (2A), a support arm from the pyramid to the panel (7H), which may be made of any type of cast metal, has been chosen. The diurnal and seasonal movement axes may be as centred as possible within the centre of gravity of the pyramid (5) so that the weight of the pyramid (5) may be equal in order to avoid tilting to any side.

The movement mechanisms produced by focusing the incident radiation (6D) on the primary lens (5A) are shown in FIGS. 7, 8 and 9: the pressure of the fluid produced by the heating of some of the surfaces of the radiation collecting and concentrating elements (5) is transmitted by the holes (7C, 8A, 10C, 10D) to the toothed pistons (7I, 8C, 9C) which, in view of the possibility of longitudinal movement, cause the pyramid (5), via the movement of the corresponding arm (7H), to rotate on the gear wheel (7F, 8D), producing the rotary movement around the axes (5F, 5G, 7E).

FIG. 9 reflects a mechanism for communicating fluid pressure between the opposite sides of the radiation collecting and concentrating elements (5), the tubes (9H) and a pressure valve (9E). The purpose of this mechanism is to compensate for required overheating of the sides on each surface to enable the pyramid/container (5) to turn to extreme angles. In these extreme positions the difference in temperature and pressure between the opposite sides of the radiation collecting and concentrating elements (5) must be significant in order to allow the piston sufficient stroke (7I). The more inclined the position of the pyramid (5), the more difference in pressure there must be for the radiation collecting and concentrating elements (5) to move the same number of degrees. The pressure valve (9E) allows the passage of pressure on opposite sides at certain intervals to allow the compensation of fluid pressure between sides, maintaining the position achieved by the fixed cogwheels (7F, 8D).

The movement of the toothed piston (7I, 8C, 9C) is longitudinal and acts upon a fixed cogwheel (7F, 8D) which, in turn, acts upon an axis of the container/pyramid, causing the container/pyramid to rotate.

The fixed cogwheels (7F, 8D) may be different in size to enable the movement sensitivity of the radiation collecting and concentrating elements (5) to vary. The bigger the cogwheel (7F, 8D) the more movement is required from the piston (7I) to vary the position of the radiation collecting and concentrating element (5) and/or the arm the same number of degrees.

A readjusting mechanism of the initial fixed position has been included in the seasonal movement fixed cogwheel (8D) via a gear lever (8H). This allows the orientation of each radiation collecting and concentrating element (5), regardless of the angle of the panel (2A), in its initial position, without differences in temperature, to the equinox, thus decreasing angulations caused by extreme movements of the container.

The radiation collecting and concentrating elements (5) may be secured to the panel structure (2A) in various ways. A single arm (5E) has been chosen, with integrated pressure tubes, with a view to economizing and standardizing production processes. The use of various securing means would be possible, for example, two arms on the north and south sides, attached onto the supporting line/guide (2C), four arms attached to the north and south sides supported by the two, lateral supporting lines (2C) of the panel structure (2A).

In another embodiment, one single arm could be used to move the radiation collecting and concentrating elements (5) or pyramids (5) adjacent to the supporting line (2C).

In another embodiment the lower vertices (6K) of the pyramids (5) situated on the same supporting line (2C) may be connected by at least one rigid joining element (for example a connecting rod) or via the optical tubes, and the arms may be connected to the same supporting line (2C) with another rod, so that it would only be necessary to introduce a few radiation collecting and concentrating elements (5) with fluid in order to produce movement. The rest of the elements would be limited to simulating the movement of the aforesaid radiation collecting and concentrating elements (5) containing fluid. This would be possible if the panels (2A) were flat and all the radiation collecting and concentrating elements (5) were to face the same direction. This embodiment, with movement matching rods, would allow the introduction of electromotor mechanisms to move the rods. The electromotors would be controlled by electronic devices which would indicate the movement to be followed to achieve their focus. The rigid connecting element or rod may alternatively be driven by indicating elements for passive movement activity so as to follow the changes in position of the source of radiation.

Another embodiment may include other mechanisms to produce the movement of the radiation collecting and concentrating elements (5) such as using a self-rotating piston having some form of thread, and a cogwheel (7F, 8D), with fine grooves, instead of teeth, to enable it to couple with the threaded piece. This would enable the piston (7I, 8C, 9C) to rotate on itself, cooperating with a cogwheel (7F, 8D) and setting it into motion.

Another embodiment includes four pistons as a motion mechanism, one for each axis, which would drive an oblique surfaced wedge (12B) attached onto the support arm (12D) of the radiation collecting and concentrating elements (5) which, upon expansion of the piston (7I, 8C), would push said piston and move it through the oblique surfaced wedge (12B), causing the element (5) to self rotate. In other words, an increase in pressure on one side of the element (5) would be communicated to the piston (7I, 8C) which would drive the oblique surfaced wedge (12B). Therefore, on attempting to expand, the piston (7I, 8C) tries to move longitudinally over the oblique surfaced wedge (12B) which causes the element (5) to rotate on the movement axis (7E, 9B).

Another embodiment may include another motion mechanism for the radiation collecting and concentrating elements (5) such as the expansion of a certain kind of material, preferably of metal, which would have an effect on a fixed oblique surfaced wedge (12B) of the radiation collecting and concentrating elements (5) to cause the radiation collecting and concentrating element (5) to rotate.

The fluids and pressure to be introduced in the side compartments of the radiation collecting and concentrating elements (5) may also be quite varied, depending on the atmospheric conditions of the site, the designed solar concentration levels, the thereto-hydraulic characteristics of the fluid, etc. The choice of the state of the fluid, gas or liquid will depend on the maximum and minimum function temperatures and their progressive behaviour in customary working temperatures. A bleeding mechanism for the fluid circuit (9I) has also been foreseen to promote air expulsion from the radiation collecting and concentrating elements (5) compartment.

The whole assembly may be calibrated via the combination of concentration levels, choosing fluid at a certain pressure and the sizes of the cogwheels (7F, 8D) so that the movement of the radiation collecting and concentrating elements (5) may produce the refocusing of the elements (5) with maximum precision and speed.

At the conclusion of the collecting process, the concentrated radiation obtained by the radiation collecting and concentrating elements originating from the secondary lens (6) and/or the reflective cone (6J) is optically coupled to radiation conduction means to be transported towards the radiation optimizing media. In general, the medium used for conducting concentrated radiation via those elements (5) is optical fibre.

Finally, the preferred media for conducting concentrated radiation via the aforesaid devices/elements (5) are mini reflectors.

Another embodiment of the panel (2A) allows the sizing of each of the very small radiation collecting and concentrating elements (5), held by supporting lines/guides (2C), attachable to curved surfaces and the radiation collecting and concentrating elements (5), allowing a sufficient degree of freedom for orientation at different angles; or even the forming of flexible panels (2A) with a sheet-like appearance, incorporating the minute radiation collecting and concentrating elements (5). These minute components would incorporate the adjusting mechanisms. Conduction of concentrated radiation via the different elements (5) in these cases should be achieved via optical fibre. This embodiment would allow the system to be perfectly attachable to surfaces such as the roof of vehicles such as cars, trucks, etc.

In order to optimize the entire behaviour of the system described above, a vacuum is established inside the container (5) in its preferred embodiment, i.e. the pyramid (5). The electromagnetic behaviour of radiation is consequently improved, as is the optical behaviour of the elements and materials inside it.

In the event that the distance between the collecting means or solar radiation collecting and concentrating element and the means for optimizing or converting the radiation directly on the concentrating point of the radiation originating from the primary lens (5A) may wish to be decreased, it would be possible to place a photovoltaic cell or any other component for radiation optimization/conversion.

DESCRIPTION OF THE DRAWINGS

FIG. 1 shows a general view of the SOLAR PANEL

3F. North-south (NS) angle.
3G. Profile of location surface.

Figure 1:
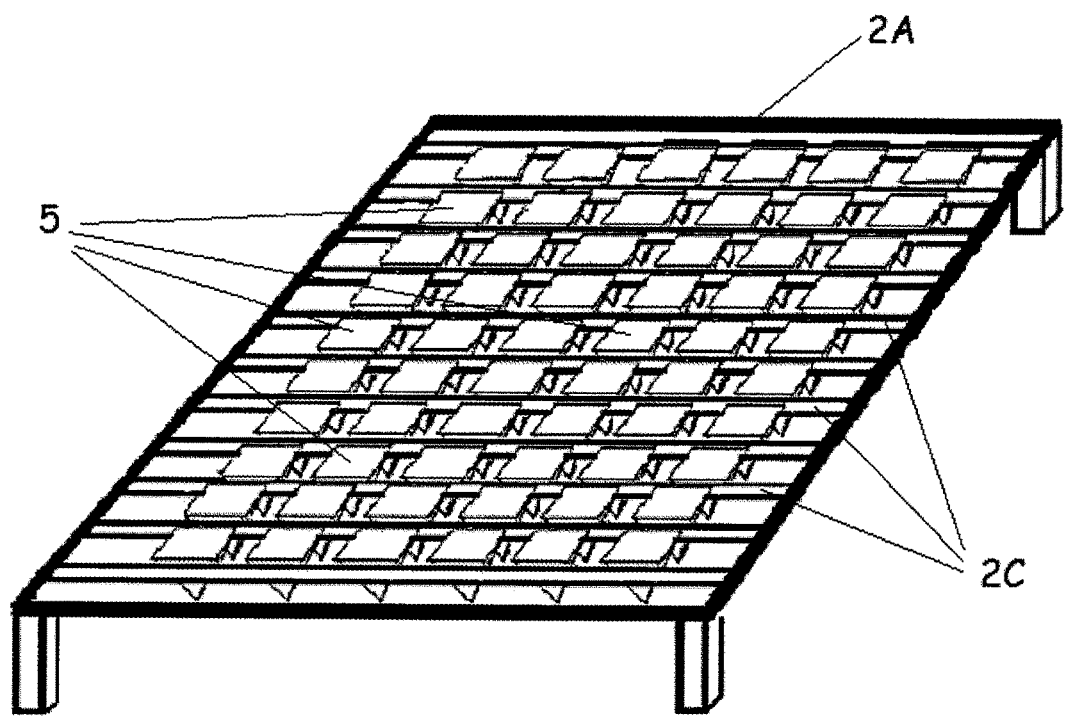
FIG. 1.
Figure 2:
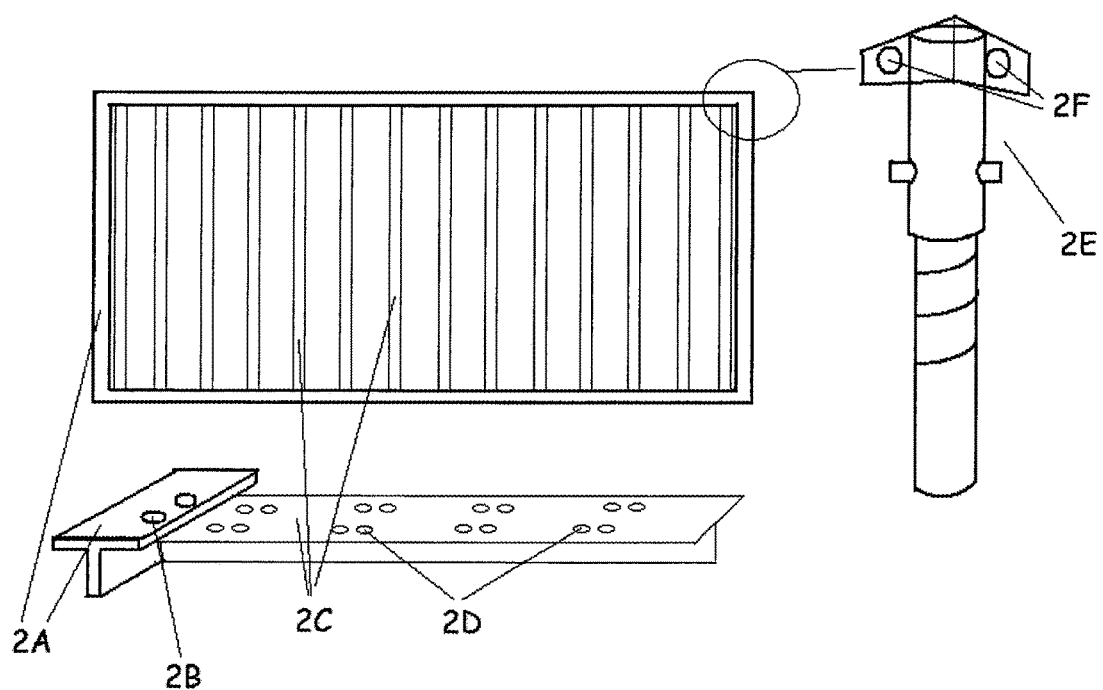
FIG. 2. ELEMENT (5) SUPPORTING STRUCTURE.
2A. Supporting frame.
2B. Frame perforations.
2C. Element (5) supporting lines,
2D. Perforations for securing the arms (5E) onto the elements (5E).
2E. Extensible leg.
2F, Securing leg (2E) to supporting frame (2A).
Figure 3:
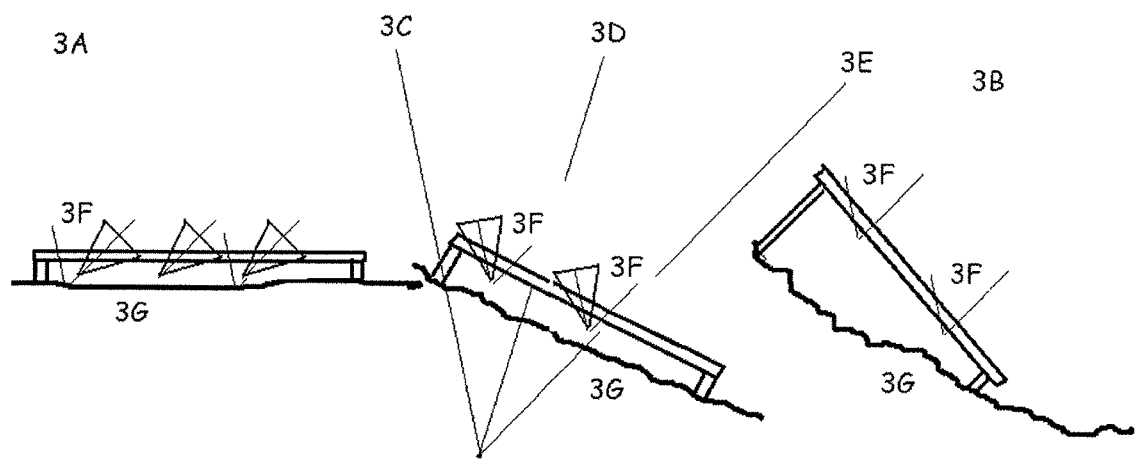
FIG. 3. SEASONAL SOLAR MOVEMENT.
3A. North pole direction.
3B. South pole direction.
3C. Summer solstice direction.
3D. Equinox direction.
3E. Winter solstice direction.
Figure 4:
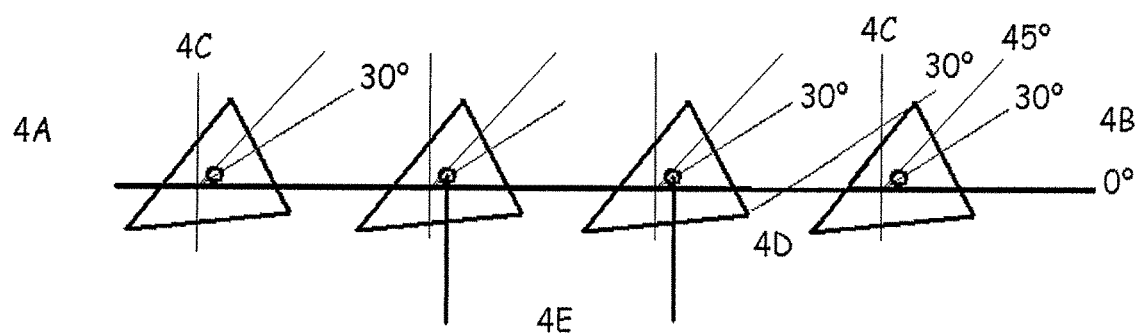
FIG. 4. DIURNAL SOLAR MOVEMENT.
4A. West-sunset,
4B. East-sunrise,
4C. 90° noon.
4D. Shaded area.
4E. Distance required between pyramids to avoid shading.
Figure 5:
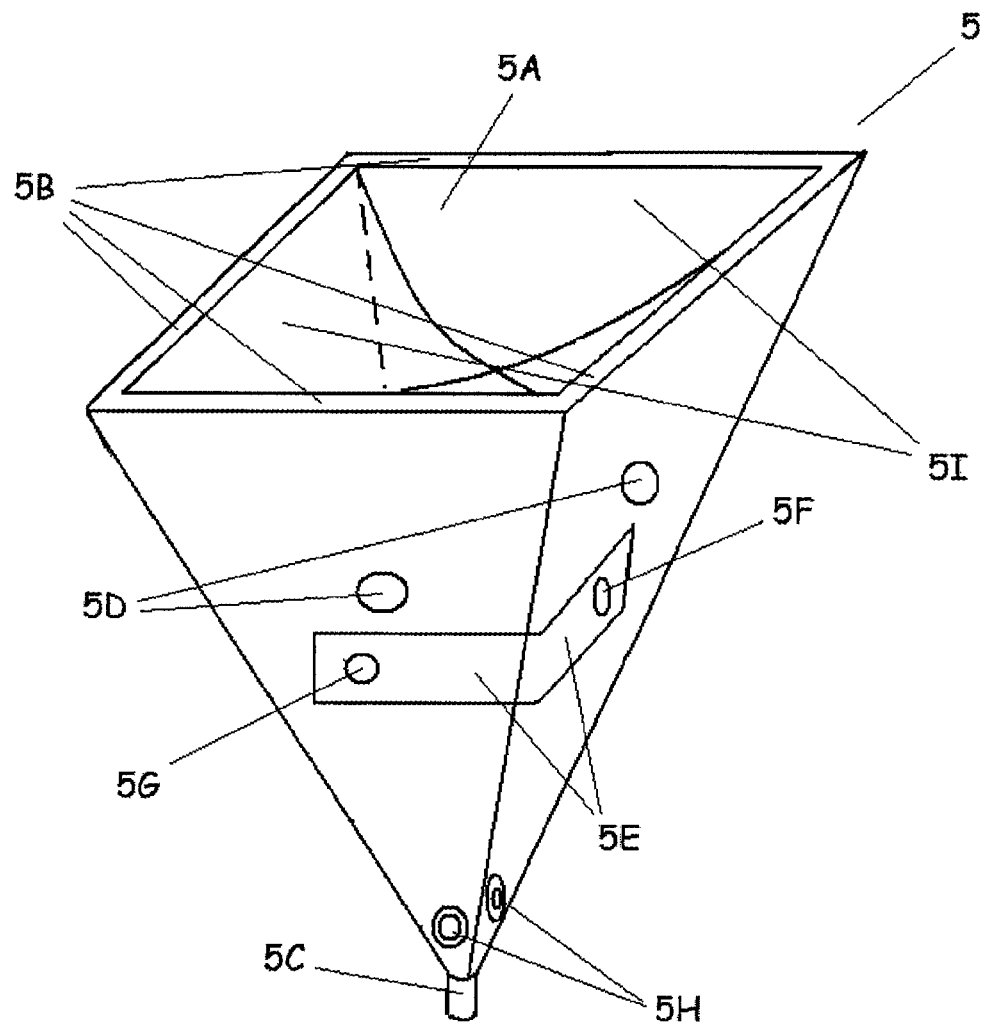
FIG. 5. PYRAMIDAL COLLECTING AND CONCENTRATING ELEMENT.
5. Radiation collecting and concentrating element. Container of preferred embodiment is a square based regular pyramid.
5A. Primary lens,
5B. Hollow compartments.
5C. Secondary lens.
5D. Holes for exit of fluid due to increased temperatures.
5E. Pyramid supporting arm.
5F. Diurnal movement axis.
5G. Seasonal movement axis.
5H. Holes for introducing fluid on the four sides of the element (5).
5I. Internal surface of one side of the pyramid (5).
Figure 6:
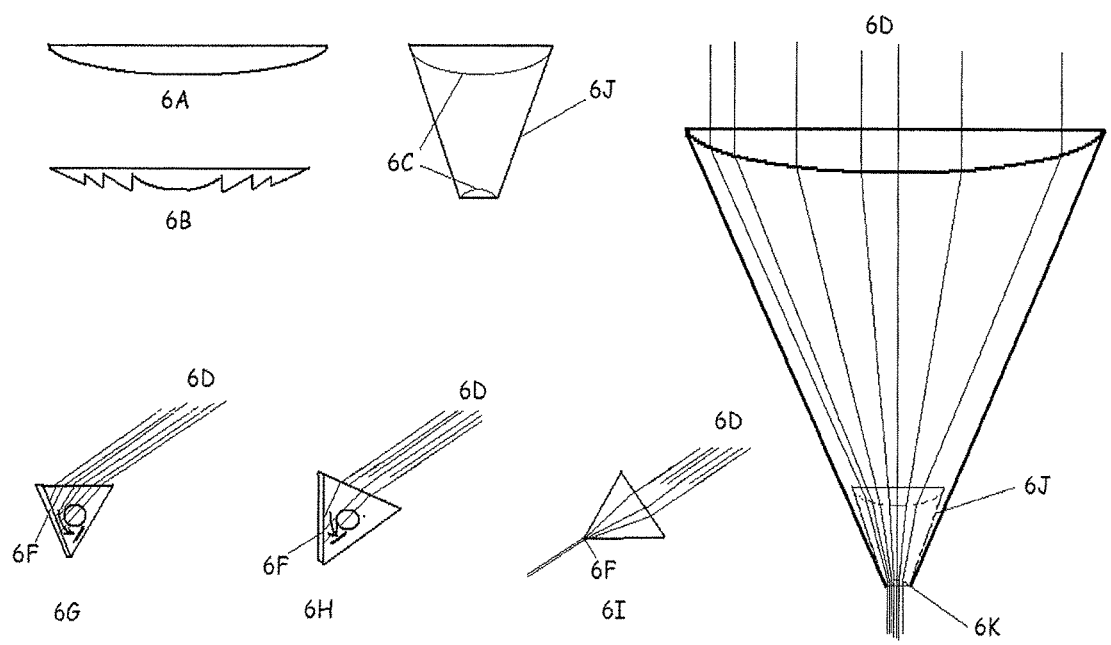
FIG. 6. LENS SECTION. DIAGRAM OF HOW THE SUN RAYS ARE REDIRECTED IN PARALLEL. FOCUSING METHOD.
6A. Primary lens (e.g. plane-convex lens).
6B. Primary lens (e.g. Fresnel lens).
6C. Secondary lens (e.g. concave-concave).
6D. Sun rays.
6F. Heat.
6G. More heat-more pressure on left side. The piston (7I) moves the pyramid (5) to the right.
6H. More heat-more pressure on the left side. The piston (7I) moves the pyramid (5) to the right.
6I. Equal heat and pressure on four sides. Pyramid remains motionless (5).
6J. Internally reflexive cone.
6K. Vertex of container/pyramid (5).
Figure 7:
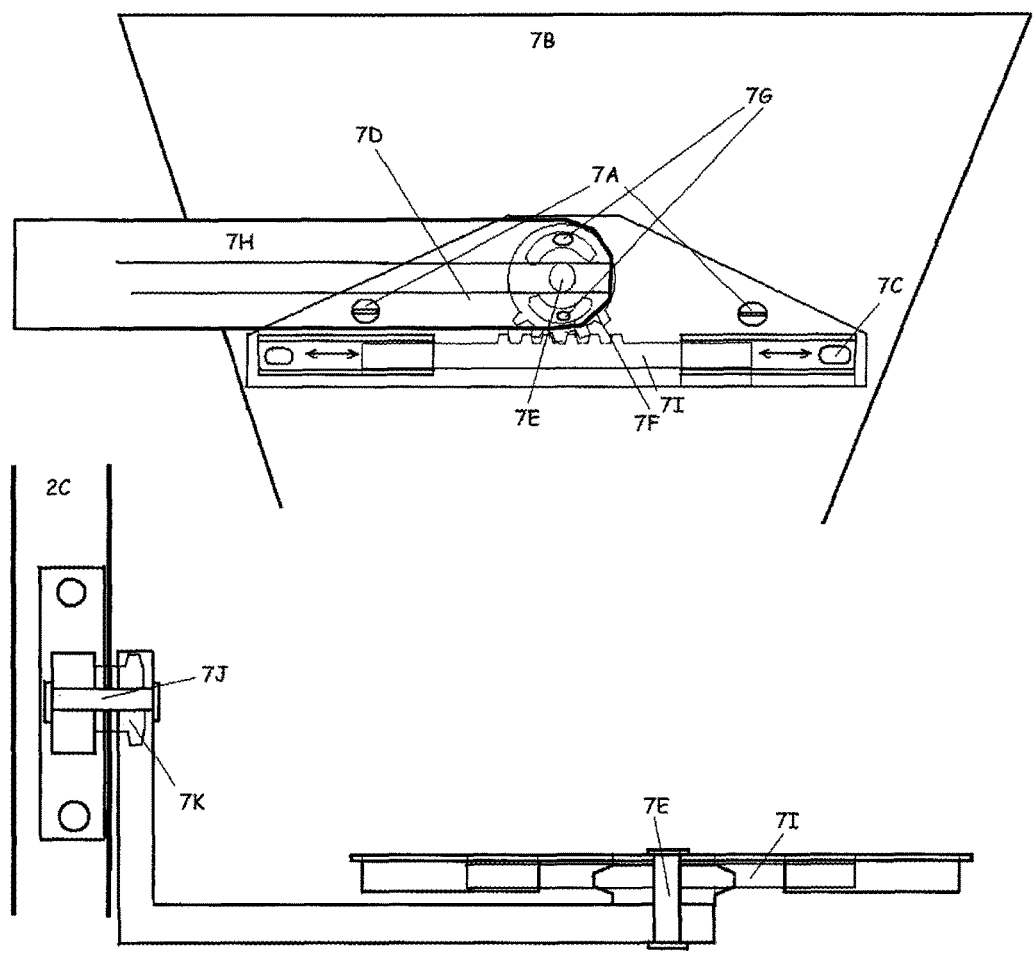
FIG. 7. DETAILS OF DIURNAL MOVEMENT MECHANISM.
7A. Screws securing the movement plate to the pyramid (5).
7B. Pyramid side (5).
7C. Right-hand fluid and pressure entry hole.
7D. Plate secured onto north side of pyramid (5).
7E. Diurnal movement pyramid-arm connecting point.
7F. Cogwheel secured onto arm (5E).
7G. North and south side fluid pressure entry holes.
7H. Arm securing pyramid to the supporting lines/guides.
7I. Pressure driven piston.
7J. Seasonal movement arm-supporting line/guide connecting point.
7K. Cogwheel secured onto supporting line/guide.
2C. Panel structure supporting line/guide.
Figure 8:
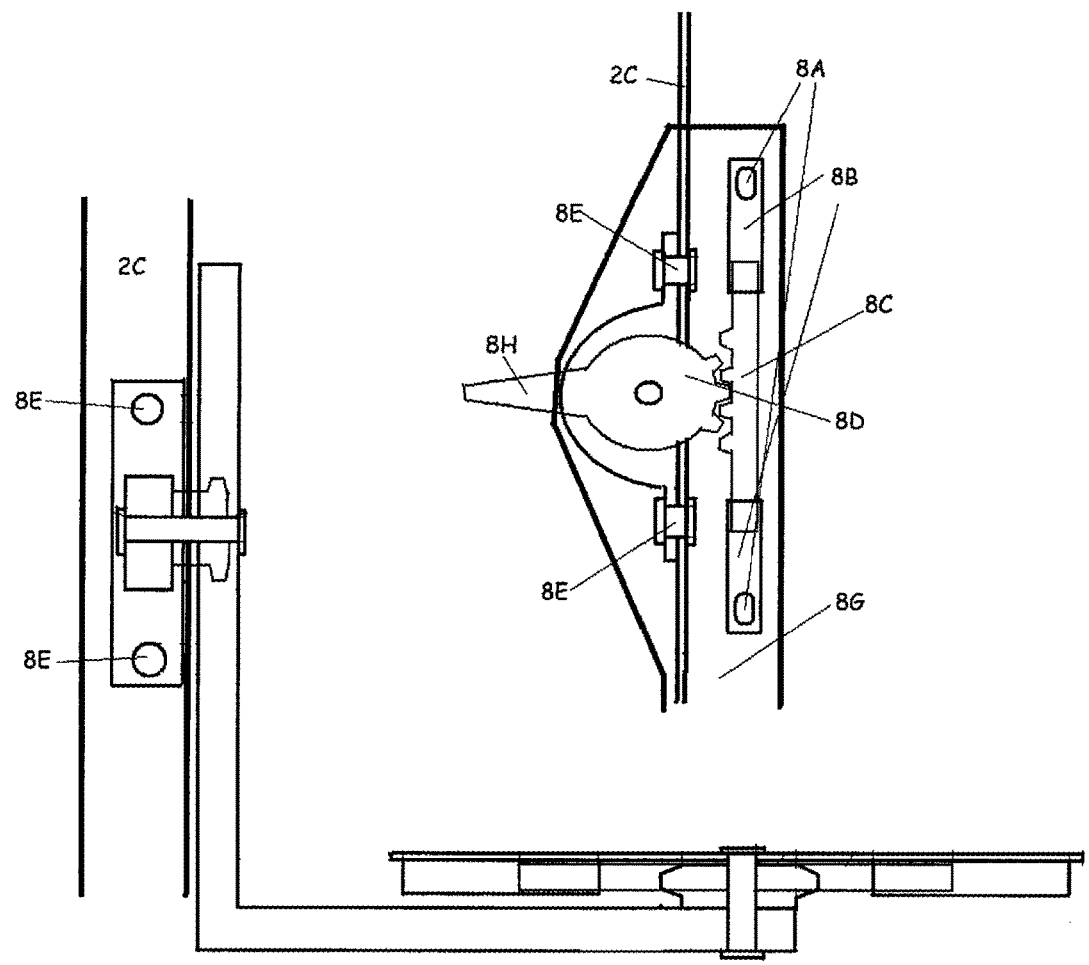
FIG. 8. DETAILS OF SEASONAL MOVEMENT MECHANISM.
8A. North-south side pressure entry holes.
8B. Piston driving cylinders (8C).
8C. Mobile toothed piston.
8D. Cogwheel secured onto supporting line/guide (2C).
8E. Screws/rivets for securing arm to structure supporting line/guide (2C).
2C. Panel structure supporting line/guide.
8G. Pyramid (5) supporting arm.
8H. Gear lever for changing seasonal movement initial fixed position.
Figure 9:
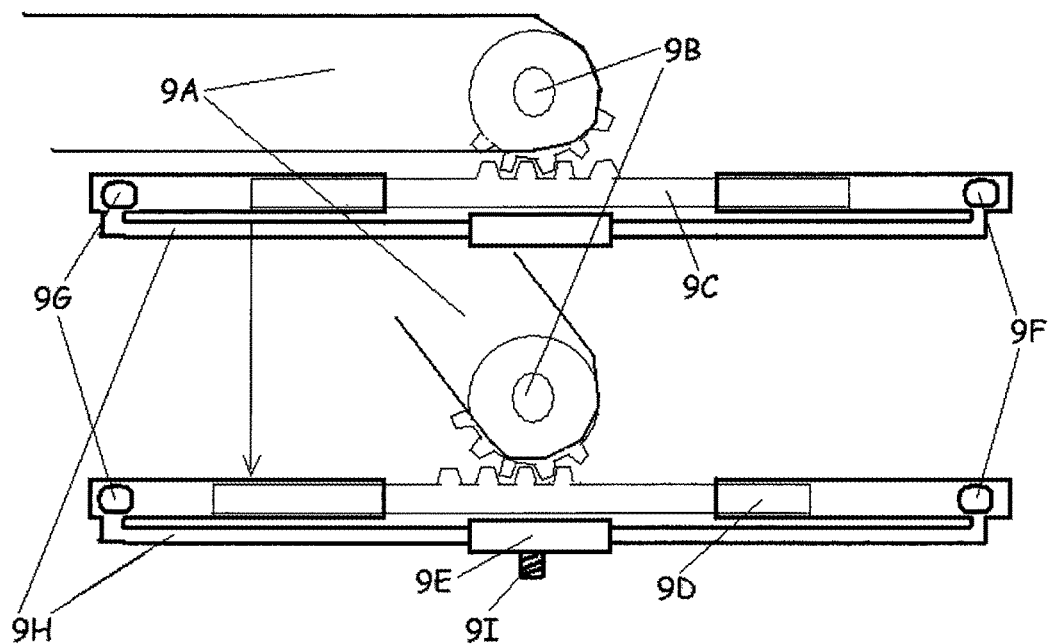
FIG. 9. MOVEMENT ON THE AXES FOR REFOCUSING PURPOSES. INTRODUCTION OF MECHANISM FOR PRESSURE COMPENSATION ON OPPOSITE SIDES.
9A. Pyramid (5) supporting arm.
9B. Diurnal axis.
9C. Initial position of piston without pressure-temperature elevation on either of the sides
9D. Position of piston with more pressure-temperature on the right side.
9E. Pressure valve.
9F. Right-hand side pressure entry hole.
9G. Left-hand side pressure entry hole.
9H. Connecting pipe for pressure from opposite sides.
9I. Fluid circuit bleed screw.
Figure 10:
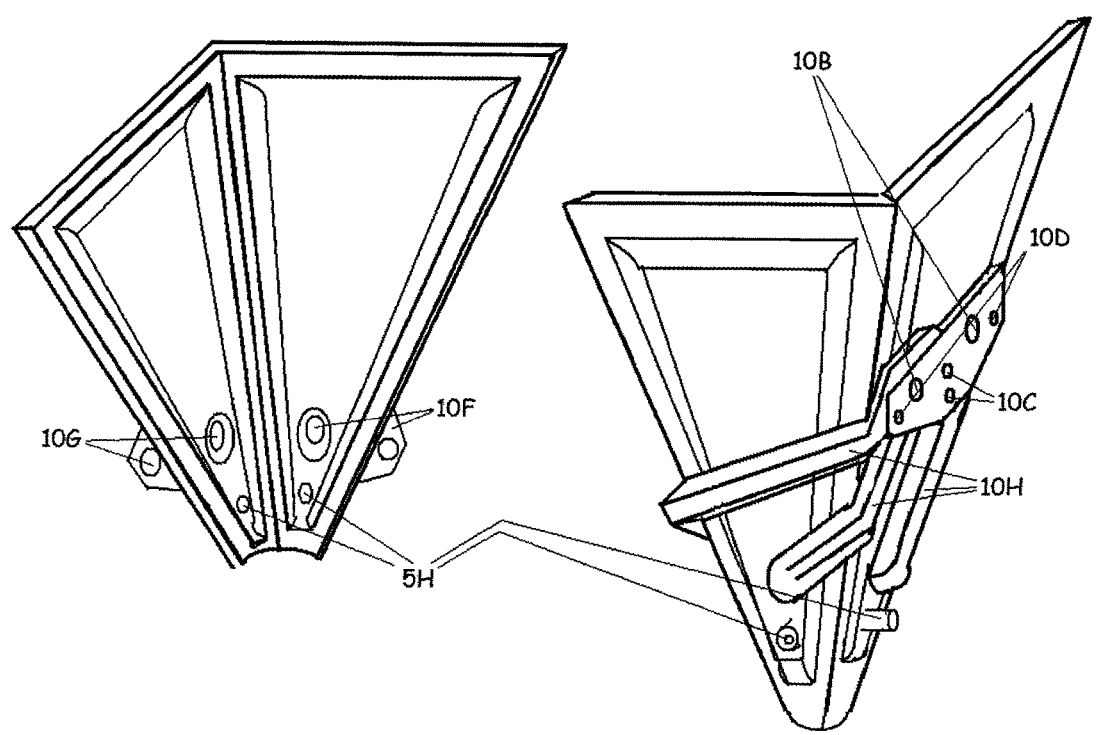
FIG. 10. VIEW OF PYRAMIDALLY SHAPED ELEMENT (5) OPEN.
5H. Holes for introducing fluid.
10B. Screws/rivets for connecting support arm.
10C. North-south pressure outlet.
10D. East-west pressure outlet.
10F, East pressure tube.
10G. South pressure tube.
10H. South, east and north pressure tubes.
Figure 11:
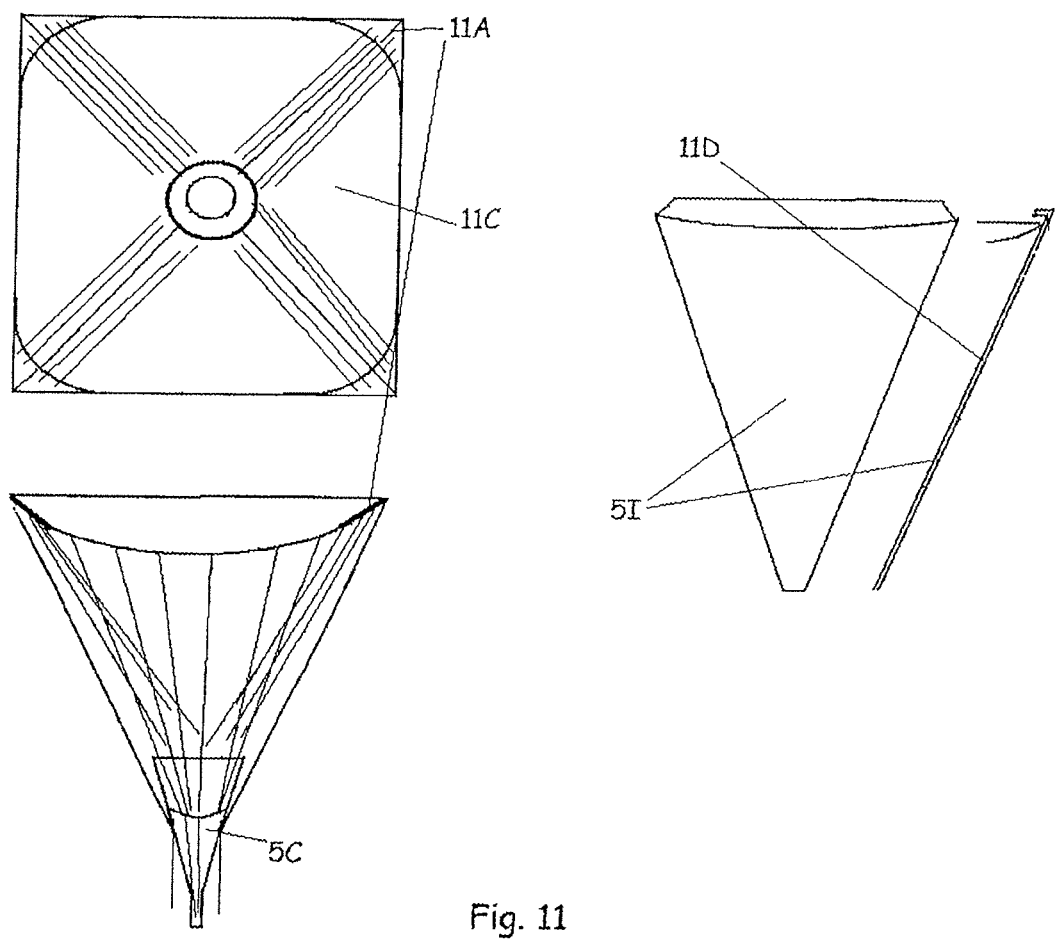
FIG. 11. DESCRIPTION OF POSITION MICRO-ADJUSTMENT. SHAPE OF INTERNAL SURFACE OF ONE SIDE OF THE ELEMENT (5).
11A. Primary lens area (5A) focusing outside the/secondary lens (5C)/internally reflexive conical element (6J).
5C. Secondary lens.
11C. Primary lens area (5A) focusing on the secondary lens (5C).
11D. High heat transfer thin sheet comprising internal surface (5I) of the pyramid (5) sides.
Figure 12:
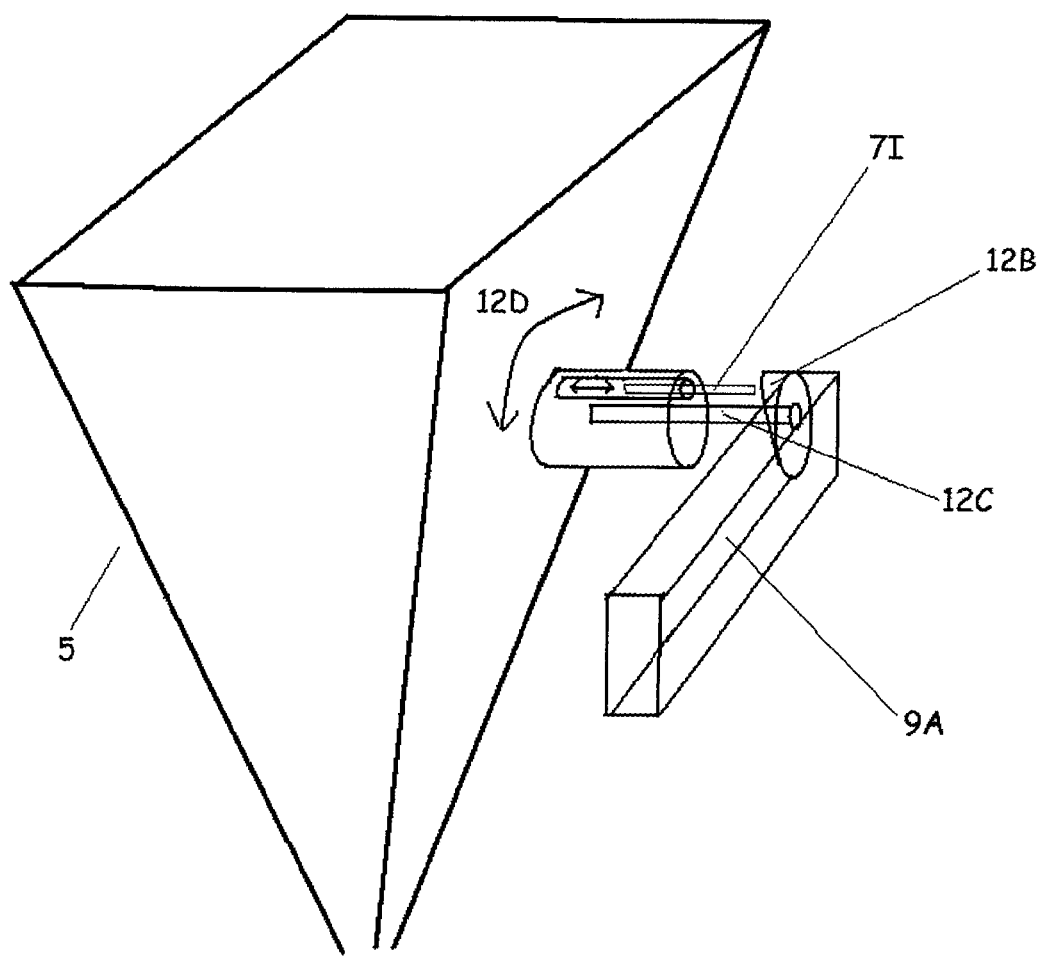
FIG. 12. DETAILS OF MOVEMENT MECHANISM VIA PISTON DRIVE (for example 7I) ON OBLIQUE SURFACED WEDGE (12B).
7I. Pressure driven piston.
12B. Piston (7I) driving oblique surfaced wedge.
12C. Movement axis.
9A. Element supporting arm.
5. Pyramidal collecting and concentrating element.
12D. Axis (12C) and pyramid (5) rotating movement.

The invention claimed is:
1. A direct solar radiation collecting and concentrating element for tracking the diurnal and seasonal movement of the sun, the direct solar radiation collecting and concentrating element comprising:
(a) a primary lens (5A); and
(b) a container (5) comprising a lower vertex (6K) and at least one upper surface upon which the primary lens (5A) is disposed, the container being configured such that radiation striking the primary lens (5A) on the at least one upper surface is concentrated onto the lower vertex (6K); the container further comprising at least one hollow, airtight and watertight compartment (5B) for housing a fluid that causes the container (5) to self-rotate based on a position of a source of the radiation striking the primary lens (5A) so as to cause the radiation to strike the primary lens with a more precise focus; the container further comprising at least one communication hole or pressure outlet (10C, 10D).
2. The direct solar radiation collecting and concentration element according to claim 1, wherein the compartment (5B) comprises a plurality of the pressure outlets (10C, 10D) and a plurality of pressure communication tubes (10F, 10G,

10H) connected to the plurality of pressure outlets on respective daily movement and seasonal movement axes.

3. The direct solar radiation collecting and concentration element according to claim 2, wherein the compartment (5B) comprises at least one hole (5H) for introduction of the fluid.

4. The direct solar radiation collecting and concentration element according to claim 3 comprising an external supporting structure and the container (5) comprises at least one support arm (7H) attached to the external supporting structure.

5. The direct solar radiation collecting and concentration element according to claim 4, comprising a toothed piston (7I, 8C, 9C) on the support arm (7H) upon which variations of the fluid in compartment (5B) are transmitted to set the container (5) in motion.

6. The direct solar radiation collecting and concentration element according to claim 5 comprising a fixed cogwheel (7F, 8D), wherein the toothed piston (7I, 8C, 9C) is disposed to moved longitudinally to act upon the fixed cogwheel to cause the fixed cogwheel to act on an axis of the container to cause the container to rotate.

7. The direct solar radiation collecting and concentration element according to claim 6 comprising a pressure valve (9E) and at least one tube (9H) connected to the pressure valve to allow an exchange of fluid pressure between opposite sides of the container (5).

8. The direct solar radiation collecting and concentration element according to claim 7, wherein the fixed cogwheel (8D) comprises a gear lever (8H) for readjusting an initial fixed position of the fixed cogwheel.

9. The direct solar radiation collecting and concentration element according to claim 8, wherein the external supporting structure comprises a plurality of supporting lines (2C) and the container (5) is secured to the support arm (7H) either by a single arm (5E) with integrated pressure tubes, by two arms on respective north and south sides of the container attached on a first of the supporting lines (2C) or by four arms attached on respective north and south sides of the container supported by two of the supporting lines (2C).

10. The direct solar radiation collecting and concentration element according to claim 9, wherein the cogwheel comprises fine grooves and the piston (7I, 8C, 9C) comprises a self-rotating groove with thread which engages with the fine grooves of the fixed cogwheel (7F, 8D).

11. The direct solar radiation collecting and concentration element according to claim 10 comprising an oblique surfaced wedge (12B) attached to a pyramid supporting arm (9A); and four toothed pistons (7I, 8C, 9C) for cooperating with the oblique surfaced wedge to cause the container to rotate on a movement axis (7E, 9B) in the event of a change in fluid pressure on a side of the container (5).

12. The direct solar radiation collecting and concentration element according to claim 11 comprising a dilatable material on the obliquely shaped wedge (12B) which interacts with the support arm (7H) when the dilatable material dilates.

13. The direct solar radiation collecting and concentration element according to claim 11 comprising a fluid circuit (9I) comprising a bleeding mechanism that allows air to be expelled from the compartment (5B) of the container (5).

14. A method comprising providing a surface comprising a plurality of the direct solar radiation collecting and concentrating elements (5) of claim 1 and calculating the distribution of the radiation collecting and concentrating elements (5) on the surface to maximize the concentration of radiation incident on the surface.

* * * * *